(12) United States Patent
Scheideler et al.

(10) Patent No.: US 7,215,163 B2
(45) Date of Patent: May 8, 2007

(54) METHOD AND DEVICE FOR FREQUENCY DIVISION AND DEMULTIPLEXING

(75) Inventors: Dirk Scheideler, München (DE); Philipp Börker, Berlin (DE)

(73) Assignee: Infineon Technologies AG, Munich (DE)

(*) Notice: Subject to any disclaimer, the term of this patent is extended or adjusted under 35 U.S.C. 154(b) by 402 days.

(21) Appl. No.: 10/953,241

(22) Filed: Sep. 29, 2004

(65) Prior Publication Data

US 2005/0134333 A1 Jun. 23, 2005

(30) Foreign Application Priority Data

Sep. 29, 2003 (DE) ................ 103 45 163

(51) Int. Cl.
*H03K 21/00* (2006.01)
(52) U.S. Cl. ............ 327/115; 327/117; 327/47
(58) Field of Classification Search ......... 327/115, 327/117; 377/47, 48
See application file for complete search history.

(56) References Cited

U.S. PATENT DOCUMENTS

| 4,443,887 A | * | 4/1984 | Shiramizu ............ 377/110 |
| 5,128,940 A | | 7/1992 | Wakimoto ............ 327/117 |
| 2003/0174798 A1 | | 9/2003 | Pickering et al. ...... 375/376 |

FOREIGN PATENT DOCUMENTS

| EP | 0 226 754 | 10/1986 |
| JP | 03172034 A | 7/1991 |
| JP | 09284246 A | 10/1997 |

OTHER PUBLICATIONS

Andreas Thiede et al., "Mixed Signal Integrated Circuits Based on GaAs HEMT's", IEEE Transactions of Very Large Scale Integration (VLSI) Systems, vol. 6, No. 1, Mar. 1998, pp. 6-17.
Manfred Lang et al., "20-40 Gb/s 0.2-μm GaAs HEMT Chip Set for Optical Data Receiver", IEEE Journal of Solid-State Circuits, vol. 32, No. 9, Sep. 1997, pp. 1384-1393.

* cited by examiner

*Primary Examiner*—Kenneth B. Wells
(74) *Attorney, Agent, or Firm*—Dicke, Billig & Czaja, P.L.L.C.

(57) ABSTRACT

A device and method is described for the frequency division of an input clock signal, in which from the input clock signal at least two output clock signals are generated, with an output pulse frequency equal to an input pulse frequency divided by a given factor, whereby with a phase detector a phase difference is measured between the at least two output signals and each of the at least two output clock signals is either inverted or not inverted, as a function of the phase difference determined. A method of this type is particularly suitable for the demultiplexing of an input data signal, and can also be designed to be multi-step.

27 Claims, 2 Drawing Sheets

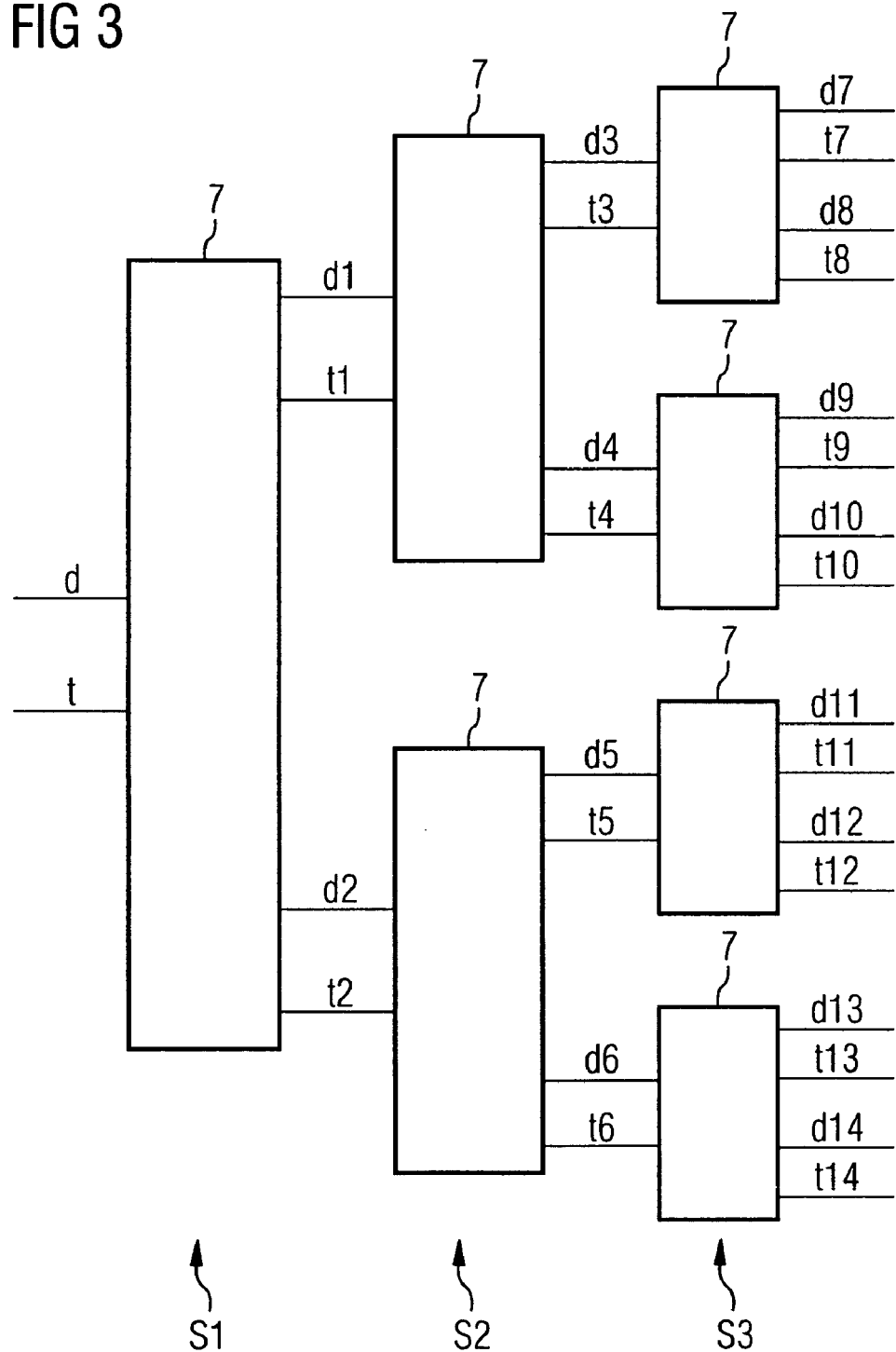

METHOD AND DEVICE FOR FREQUENCY DIVISION AND DEMULTIPLEXING

CROSS-REFERENCE TO RELATED APPLICATIONS

This Utility Patent Application claims priority to German patent application No. DE 103 45 163.3, filed on Sep. 29, 2003, which is incorporated herein by reference.

FIELD OF THE INVENTION

The present invention relates to a method and a device for the frequency division of a clock signal and the use of the method and device respectively for the demultiplexing of a data signal. A method and device of this type are used in particular in very high speed data receivers, in which data is received at a bit rate in the range of several Gigabits per second.

BACKGROUND

With high speed (e.g., several Gigabits per second) data receivers of this type, a received data signal is typically sampled with a clock signal, which has a frequency of the value of half the data rate of the data signal, in order in this way to create two data signals with half the data rate. This process is repeated in several steps, the data rate of the data signals being halved at each step. To achieve this, in each step clock signals with a corresponding clock frequency are required, which are likewise halved at every step.

Conventionally, these clock signals are generated by a central clock frequency divider. The consequence of this is that the clock signals need to be conveyed over broad paths to scanning units of the different steps, which at high speeds is difficult and leads to a circuit structure which is not entirely symmetrical, which can lead to imprecisions in the sampling of the data.

In addition to this, when demultiplexing the data, (i.e., when sampling the data with the individual clock signal in each case) output data signals are frequently generated which are displaced mutually by half a bit length. This displacement must be compensated for, for example by temporary storage during half a clock pulse cycle, in order nevertheless for a central clock signal generation to be used. In this situation, however, in practice an additional problem frequently arises in that the temporarily-stored data can be more strongly amplified in relation to the other data, which incurs undesirable dependencies of a bit failure rate and a clock recovery from a position of a bit in the data flow which is received in each case. In addition to this, temporary storage of this kind can also be difficult, depending on the circuit technology used.

Another formulation consists of using what is referred to as a distributed frequency divider structure, i.e., of dividing the clock pulses down parallel to the sampling devices. However, in view of the fact that, with the frequency dividers which are normally used, the initial state is determined at random, in this situation what is referred to as reset synchronization is required, in order for all the frequency dividers to start in a defined state. A reset synchronization of this kind is, however, very difficult to achieve at high speeds.

If, in addition to this, what is referred to as a half-rate arrangement with a quadrature oscillator is pursued, in which the oscillator runs at half the clock frequency of the data rate, and the four phases of the quadrature oscillator produced are used to sample the data signal, then as early as in the first step several frequency dividers must be used in parallel to divide down the individual clock phases of the oscillator. With a quadrature oscillator these clock phases are displaced mutually by a quarter pulse. This slight displacement, and the need for several frequency dividers which must start in the same start state, make reset synchronisation with a distributed structure practically impossible. Accordingly, a distributed frequency divider structure is normally not used at high speeds.

SUMMARY

The present invention provides a method and device suitable for frequency division, multiplexing, and demultiplexing a signal. In one embodiment, a method is used for the frequency division of an input clock signal, in which from the input clock signal at least two output clock signals are generated, with an output pulse frequency equal to an input pulse frequency divided by a given factor, whereby with a phase detector a phase difference is measured between the at least two output signals and each of the at least two output clock signals is either inverted or not inverted, as a function of the phase difference determined. A method of this type is particularly suitable for the demultiplexing of an input data signal, and can also be designed to be multi-step.

BRIEF DESCRIPTION OF THE DRAWING

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated, as they become better understood by reference to the following detailed description. The elements of the drawings are not necessarily to scale relative to each other. Like reference numerals designate corresponding similar parts.

FIG. 3 illustrates a device with devices according to the embodiment of FIG. 2 connected in step fashion serially.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as"top,""bottom,""front,""back,""leading,""trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
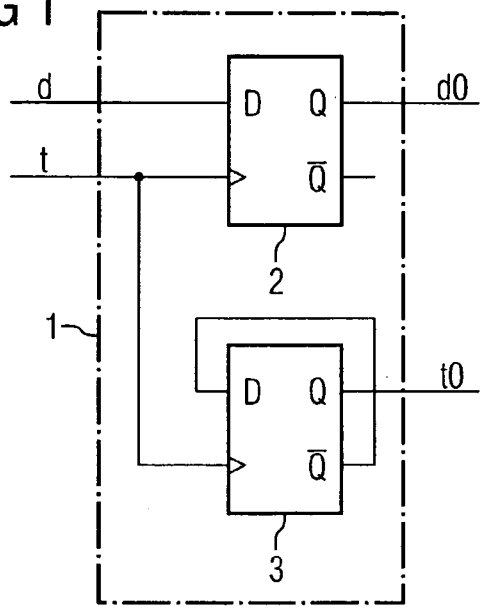
FIG. 1 illustrates one embodiment of a combined frequency divider and demultiplexer cell.

FIG. 1 illustrates one embodiment of a demultiplexer basic cell 1, which serves to sample an input data signal d and to simultaneously divide the frequency of an input clock signal t. To sample this input data signal, it is fed to a data input D of a first D-flip-flop 2, and the input clock signal t is fed correspondingly to a clock input of this D-flip-flop 2. In this situation, in the present example, the input clock signal t has a clock frequency which is half as large as a data rate of the input data signal d. The data rate can be 10 GHz and the clock frequency 5 GHz, for example. Accordingly, a data signal d0 is created, with half the data rate of the data signal d.

The input clock signal t is, in addition, fed to a clock input of a second D-flip-flop 3. An inverted output Q of this second D-flip-flop 3 is connected back into a data input D of this D-flip-flop 3. At a non-inverted output Q of the D-flip-flop 3, a clock signal t0 can then be tapped, which has half the clock frequency compared to the input clock signal t. An output state of the clock signal t0 in this situation depends on the initial state of the inverted output Q of the second D-flip-flop 3, and is therefore not determined in a defined manner.

This demultiplexer basic cell has the advantage that all the signal lines are symmetrical, as a result of which delays in a demultiplexer tree can be kept the same. This demultiplexer basic cell can in principle also be used in devices other than those described hereinafter.

In principle, however, other means are also conceivable for a demultiplexer basic cell 1 of this kind for the sampling of the input data signal d and for the frequency division of the input clock signal t, and other division factors than the factor two are also possible.

Figure 2:
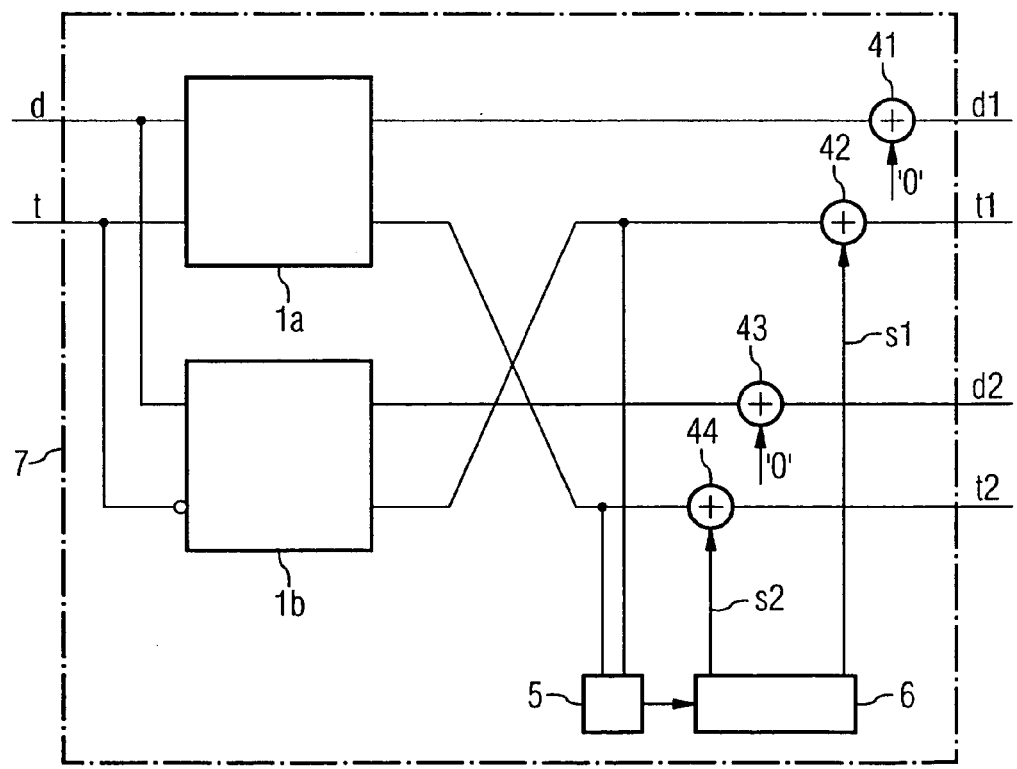
FIG. 2 illustrates an embodiment according to the invention of a demultiplexing device making use of the cell from FIG. 1.

FIG. 2 illustrates a demultiplexer 7 according to the invention, which comprises essentially two demultiplexer basic cells 1a, 1b, which are made up in the same way as the demultiplexer basic cell 1 from FIG. 1. In this situation, the input data signal d and the input clock signal t are fed unaltered to a demultiplexer basic cell 1a, while the input clock signal is fed in inverted form to the demultiplexer basic cell 1b. As an alternative, the D-flip-flops of the demultiplexer basic cell 1b can also be controlled by a falling flank of the input clock signal t, while the D-flip-flops of the demultiplexer basic cell 1a are controlled by a rising flank of the input clock signal t. The effect of this is that, for example, the output data signal d1 emitted by the demultiplexer basic cell 1a comprises only even bits of the input data signal d, while the output data signal d2 emitted by the demultiplexer basic cell 1b correspondingly contains only odd bits.

Accordingly, an output clock signal t2 generated by the demultiplexer basic cell 1a and an output clock signal t1 generated by the demultiplexer basic cell 1b are offset in relation to one another.

As illustrated in FIG. 2, in this situation the output clock signal t1 is allocated to the output data signal d1, and the output clock signal t2 is allocated to the output data signal d2, which is achieved by a simple crossing of the lines. This is due to the fact that, for a multi-step demultiplexer structure, as described hereinafter, the pulse flanks of the output clock signals t1 and t2 should lie in the middle of the bits of the output data signals d1 and d2 allocated to them, in order, in a subsequent step, to guarantee reliable sampling.

As already explained by reference to FIG. 1, the initial state of the output clock signals t1 and t2 is not defined. In order to compensate for this, a phase detector 5 is provided, which compares the phase position of the output clock signals t1 and t2 and transfers a phase signal determined in this way to a control unit 6. Depending on the phase position, the control unit 6 controls Exclusive-Or gates 42 and 44 with actuating signals s1 and s2, to which the clock signals t1 and t2 are fed. Accordingly, if required, one or both of the clock signals can be inverted in order to guarantee a desired phase position.

Exclusive-or gates 41 and 43 of this type are preferably also present in the lines for the output data signals d1 and d2, to which a zero signal is fed, so that they allow the output data signals through unchanged. As a result of this measure, a matching of the run time of the output clock signals t1, t2, and of the output data signals d1, d2, is achieved.

Illustrated in FIG. 3 is a multi-step demultiplexer according to one embodiment of the invention. The first step S1 in this situation comprises a demultiplexer 7, whereby in each case an output data signal d1, d2, and, allocated to these, output clock signals t1, t2, are conducted to two further demultiplexers 7 in the second step S2. The data signals d3 to d6 and clock signals t3 to t6 that are generated in this way are conducted to four further demultiplexers 7 in the third step S3, so that finally eight output data signals d7 to d14 and eight output clock signals t7 to t14 are generated. A device of this type can of course also contain only two steps, or may comprise more than three steps.

The phase detection illustrated in FIG. 2 can be extended with a structure of this kind, in that the phase differences determined by the phase detectors 5 are fed together to the control means 6, and additional phase detectors between pulse outputs of different demultiplexers 7 of a step are also conceivable. The control means 6 then determine the phase position of the different output clock signals in relation to one another, for example by means of a logic circuit, and control the Exclusive-Or gates of the different demultiplexers 7 accordingly, in order to set a desired phase relationship.

In the event of a clock structure distributed in this manner being required for applications other than the demultiplexing of data, this can be achieved simply by omitting the path for the data in FIGS. 1 to 3.

A clock frequency divider structure of this type can be combined in particular with a quadrature oscillator to generate the input clock signal t.

A particular advantage of the device according to the invention lies in the fact that all the data paths are structured in an identical manner and the frequency division is made substantially easier. Likewise, no delays are required, as described in the introduction to the description. The additional elaboration of the circuit in which this incurs, in that for each output data signal a separate clock signal is generated, is relatively small, and is also compensated for by doing away in part with the temporary storage.

It is therefore possible, without any reset synchronization circuit and with little effort, to ensure the correct operation of a distributed frequency divider structure in a demultiplexer tree. In addition to this, in the last step, the path for the frequency division can be done away with, if the pulses are no longer required. The temporal arrangement of the individual data bits next to one another is effected in this situation at slower pulse rates than the input pulse frequency, with the result that difficulties with the temporary storage of a bit can be avoided.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for the frequency division of an input clock signal comprising:
   generating from the input clock signal with an input clock frequency, at least two output clock signals each with an output clock frequency equal to the input clock frequency divided by a respective predetermined factor; and
   measuring a phase difference between the at least two output clock signals, wherein each of the at least two output clock signals is either inverted or not inverted, as a function of the phase difference.

2. The method according to claim 1, comprising:
   generating a first output clock signal of the at least two output clock signals by frequency division of the input clock signal; and
   generating a second output clock signal of the at least two output clock signals by frequency division of the inverted input clock signal.

3. The method according to claim 1, comprising defining the predetermined factor for each of the output clock signals is two.

4. A method for frequency division of an input clock signal, comprising:
   defining the frequency division as being carried out in n steps, in which n is at least two, wherein in the first step comprises:
   generating from the input clock signal with an input clock frequency, at least two output clock signals each with an output clock frequency equal to the input clock frequency divided by a respective predetermined factor; and
   measuring a phase difference between the at least two output clock signals, wherein each of the at least two output clock signals is either inverted or not inverted, as a function of the phase difference; and
   wherein the steps 2 to n the output clock signals of the previous step are used as respective input clock signals for a method according to step 1 in the following step.

5. The method according to claim 4, where in each step the phase differences are measured between a plurality of all the output clock signals generated in this individual step, and wherein each of the output clock signals of this individual step in each case is either inverted or not inverted, as a function of the phase differences of this individual step.

6. A method for the demultiplexing of data, comprising:
   processing an input clock signal using a method for the frequency division of an input clock signal comprising:
   generating from the input clock signal with an input clock frequency, at least two output clock signals each with an output clock frequency equal to the input clock frequency divided by a respective predetermined factor; and
   measuring a phase difference between the at least two output clock signals, wherein each of the at least two output clock signals is either inverted or not inverted, as a function of the phase difference; and
   wherein an input data signal is sampled with the input clock signal, in order to generate a first output data signal, wherein the input data signal is sampled with the inverted input clock signal, in order to generate a second output data signal, and wherein the at least two output clock signals are respectively allocated to the first output data signal and to the second output data signal.

7. The method according to claim 6, comprising:
   allocating a first output clock signal of the at least two output clock signals to the second output data signal; and allocating a second output clock signal of the at least two output clock signals to the first output data signal.

8. The method according to claim 6, wherein the demultiplexing is carried out in n steps, in which n is at least 2, and wherein in the first step the method for demultiplexing data is carried out, and in the steps 2 to n the output data signals of the previous step are used together with the output clock signals respectively allocated to them, as input data signals and input clock signals for using the method for demultiplexing data in the following step.

9. The method according to claim 6, comprising defining the input clock frequency as half as great as a data rate of the input data signal.

10. A device for the frequency division of an input clock signal with a main clock input for the feeding of the input clock signal, comprising:
    first frequency division means and second frequency division means for the generation of a first output clock signal and a second output clock signal, respectively, each having a frequency of the input clock signal divided by a respective specific factor;
    a clock input of the first or the second frequency division means respectively is connected to the main clock input;
    an output of the first and the second frequency division means respectively connected to a first and a second clock output respectively;
    phase detector means to determine a phase difference between the first and the second output clock signals;
    controllable inverter means arranged between the output of the first and second frequency division means and the respective first and second clock output, for the optional separate inversion of the first and the second output clock signal; and
    control means for the actuation of the inverter means as a function of the phase difference.

11. The device according to claim 10, wherein the specific factor for each of the output clock signals is two.

12. The device according to claim 10, wherein inverter means are connected between the main clock input and the clock input of the second frequency division means.

13. The device according to claim 10, wherein the first and second frequency division means each comprise a D-flip-flop circuit, wherein a clock input of each D-flip-flop circuit is connected to the main clock input, wherein an inverted output of each D-flip-flop circuit is connected to a data input of the respective D-flip-flop circuit, and wherein a non-inverted output of each D-flip-flop circuit is connected to the first or second clock output, respectively.

14. The device according to claim 10, wherein the controllable inverter means comprises:
    a first and a second Exclusive-Or circuit, wherein in each case a first input of the first and the second Exclusive-Or circuit is connected to an output of the first and the second frequency division means respectively, wherein in each case a second input of the first and the second Exclusive-Or circuit is connected to the control means, and wherein in each case an output of the first and the second Exclusive-Or circuit is connected to the first and the second clock output respectively.

15. An apparatus for the frequency division of an input clock signal, wherein the apparatus comprises:

n steps, in which n is at least 2, wherein the first step comprises a device according to claim 10, wherein the steps 2 to n comprise in each case a plurality of devices according to claims 10, and wherein each clock output of the steps 1 to n–1 is connected to a main clock input of the following step.

16. A device for demultiplexing of an input data signal comprising:

a main data input for the feeding of the input data signal, a device according to claim 10 for the processing of an input clock signal, a first and a second sampling device, wherein a clock input of the first or second sampling device respectively is connected to the main clock input, a data input of the first and second sampling device respectively is connected to the main data input, and an output of the first and second sampling device is connected to a first and second data output respectively for the output of a first or second output data signal respectively.

17. The device according to claim 16, comprising an inverter between the main clock input and the clock input of the second sampling device.

18. The device according to claim 16, comprising controllable inverter means between the output of the first and the second sampling device and the respective first and second data output, which inverter means are designed to be the same as the controllable inverter means between the first and second pulse division means and the respective first and second pulse output, and which are actuated in such a way that the first and the second output data signals are not inverted.

19. The device according to claim 16, wherein the first sampling device comprises a first D-flip-flop circuit and the second sampling device comprises a second D-flip-flop circuit, wherein the main data input is connected to a data input of the first and of the second D-flip-flop circuit, wherein the main clock input is connected to a clock input of the first and of the second D-flip-flop circuit, and wherein the first and second data output is connected to an output of the first and the second D-flip-flop circuit respectively.

20. An apparatus for the demultiplexing of an input data signal, wherein the apparatus comprises:

n steps, in which n is at least 2, wherein the first step comprises a device according to claim 16, wherein the steps 2 to n comprise a plurality of devices according to claim 16, and wherein each clock output of the steps 1 to n–1 is connected to a main clock input of the step following, and wherein each data output of the steps 1 to n–1 is connected to a main data input of the step following.

21. The apparatus according to claim 20, wherein in each case the first clock output and the second data output, as well as the second clock output and the first data output of a device of the steps 1 to n–1 are connected to the main clock input or the main data input respectively of a device of the step following.

22. The apparatus according to claim 16, wherein the frequency of the input clock signal is half as large as a data rate of the input data signal.

23. A device for the frequency division of an input clock signal with a main clock input for the feeding of the input clock signal, comprising:

a first frequency division and a second frequency division for the generation of a first output clock signal and a second output clock signal, respectively, each having a frequency of the input clock signal divided by a respective specific factor;

a clock input of the first or the second frequency division respectively is connected to the main clock input;

an output of the first and the second frequency division respectively connected to a first and a second clock output respectively;

a phase detector means to determine a phase difference between the first and the second output clock signals;

a controllable inverter arranged between the output of the first and second frequency division and the respective first and second clock output, for the optional separate inversion of the first and the second output clock signal; and a control system for the actuation of the inverter as a function of the phase difference.

24. The device according to claim 23, wherein the specific factor for each of the output clock signals is two.

25. The device according to claim 23, wherein inverter means are connected between the main clock input and the clock input of the second frequency division.

26. The device according to claim 23, wherein the first and second frequency division each comprise a D-flip-flop circuit, wherein a clock input of each D-flip-flop circuit is connected to the main clock input, wherein an inverted output of each D-flip-flop circuit is connected to a data input of the respective D-flip-flop circuit, and wherein a non-inverted output of each D-flip-flop circuit is connected to the first or second clock output, respectively.

27. The device according to claim 23, wherein the controllable inverter comprises:

a first and a second Exclusive-Or circuit, wherein in each case a first input of the first and the second Exclusive-Or circuit is connected to an output of the first and the second frequency division respectively, wherein in each case a second input of the first and the second Exclusive-Or circuit is connected to the control, and wherein in each case an output of the first and the second Exclusive-Or circuit is connected to the first and the second clock output respectively.

* * * * *